United States Patent
Lee

(10) Patent No.: US 7,696,577 B2
(45) Date of Patent: Apr. 13, 2010

(54) MEMORY CELL ARRAY IN A SEMICONDUCTOR MEMORY DEVICE WITH SELECT LINES FORMED IN A U-LIKE SHAPE

(75) Inventor: Keun Woo Lee, Kyeonggi-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 123 days.

(21) Appl. No.: 11/771,146

(22) Filed: Jun. 29, 2007

(65) Prior Publication Data

US 2008/0251847 A1 Oct. 16, 2008

(30) Foreign Application Priority Data

Apr. 12, 2007 (KR) .................. 10-2007-0035962

(51) Int. Cl.
*H01L 27/105* (2006.01)
(52) U.S. Cl. .................. 257/365; 257/316; 257/390; 257/E27.081
(58) Field of Classification Search .......... 257/316, 257/322, 365, 390, E27.081
See application file for complete search history.

(56) References Cited

U.S. PATENT DOCUMENTS

2005/0230738 A1* 10/2005 Lee ...................... 257/315

FOREIGN PATENT DOCUMENTS

| JP | 05-145046 | 6/1993 |
|----|-----------|--------|
| KR | 10-1997-0013374 | 3/1997 |
| KR | 10-0184458 | 12/1998 |
| KR | 10-2000-0019971 | 4/2000 |

OTHER PUBLICATIONS

Korean Notice of Allowance dated Nov. 12, 2008, for Korean application No. 2007-0035962.
Office action for Korean patent app. 2007-35962.

* cited by examiner

*Primary Examiner*—Lynne A Gurley
*Assistant Examiner*—Vernon P Webb
(74) *Attorney, Agent, or Firm*—Lowe Hauptman Ham & Berner, LLP

(57) ABSTRACT

A memory cell array in a semiconductor device includes a semiconductor substrate having active areas and isolation areas in parallel, a plurality of select lines having generally a U like shape and is configured to cross over the active areas and the isolation areas, and a plurality of word lines formed between the select lines. In view of the select line being formed in U like shape, an occurrence of a punch through phenomenon is prevented by a junction area formed between the select lines. As a result, a margin for reducing a width of the select line is increased.

8 Claims, 2 Drawing Sheets

MEMORY CELL ARRAY IN A SEMICONDUCTOR MEMORY DEVICE WITH SELECT LINES FORMED IN A U-LIKE SHAPE

CROSS-REFERENCE TO RELATED APPLICATIONS

This application claims priority from Korean Patent Application No. 2007-35962, filed on Apr. 12, 2007, the contents of which are incorporated herein by reference in its entirety.

BACKGROUND OF THE INVENTION

The present invention relates to a memory cell array. More particularly, to a memory cell array in a semiconductor memory device wherein a width of a select line having a source select line SSL and a drain select line DSL is reduced.

Generally, a semiconductor memory device includes a volatile memory device where data are extinguished when a power is not supplied and a non-volatile memory device where data are maintained though the power is not supplied. The volatile memory device has a dynamic random access memory (DRAM) and a static random access memory (SRAM).

The non-volatile memory device includes an electrically erasable and programmable ROM (EEPROM) where data may be inputted or outputted electrically and a flash memory device, etc.

Especially, the flash memory device is a device improved compared to the EEPROM, and controls electrically an input/output of data by using Fowler-Nordheim tunneling (F-N tunneling) phenomenon or a hot electron injection phenomenon.

In addition, the flash memory device is divided into a NAND flash memory and a NOR flash memory.

The NAND flash memory includes a cell string where memory cell transistors are connected in series one another and with word lines. The word lines are connected in parallel between a bit line and a common source line.

In the NOR flash memory, each of memory cell transistors is connected in parallel between a bit line and a common source line.

The NOR flash memory has an excellent fast-operation characteristic because data are inputted/outputted in an unit of a memory cell transistor. However, the characteristic is not good in view of degree of integration. Whereas, the NAND flash memory has an excellent integration characteristic because data are inputted/outputted in an unit of a word line.

The NAND flash memory has a select line included in a memory cell array, wherein select transistors are connected in series with the select line. Here, the select line is formed at both terminals of a cell string where memory cell transistors are connected in series to one another. Additionally, the select line selects the cell string for inputting/outputting data or interrupts a cell string that has not been selected.

SUMMARY OF THE INVENTION

It is an object of the present invention to provide a memory cell array in a semiconductor memory device. In view of a select line in the memory cell array being generally a U like shape, an occurrence of a punch through phenomenon is prevented by a junction area formed between the select lines. As a result, a margin for reducing a width of the select line is increased.

A memory cell array in a semiconductor memory device according to one example embodiment of the present invention includes a semiconductor substrate having active areas and isolation areas in parallel; a plurality of select lines having a U like shape which is configured to cross over the active areas and the isolation areas; and a plurality of word lines formed between the select lines.

Select transistors formed in a cross area of the select line and the active areas form a dual gate. A junction area is formed in between the dual gate, wherein a line width of one side of the select line is same or substantially equal to that of the word line, a width between the select lines is same or substantially equal to that of the word line. The select line includes a source select line and a drain select line. In addition, since the line width between the select lines may be formed with the same as a width of the word line, high integrated semiconductor memory device may be manufactured.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1A:
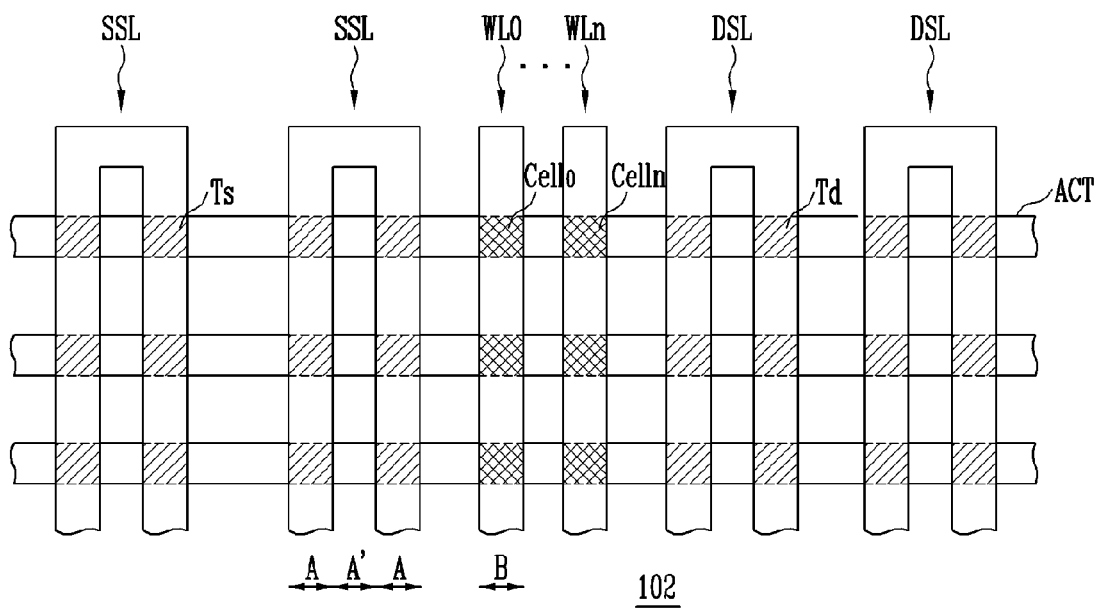
FIG. 1A is a plan view illustrating a memory cell array in a semiconductor memory device according to one embodiment of the present invention.
Figure 1B:
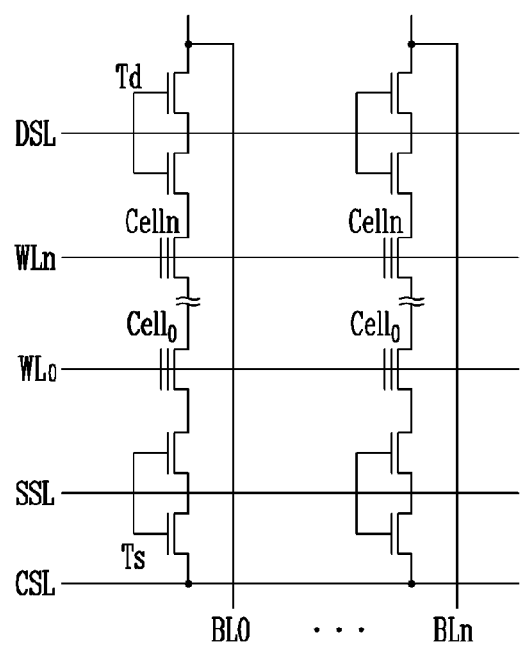
FIG. 1B is a view illustrating a circuitry of the memory cell array in the semiconductor memory device according to the present invention.
Figure 1C:
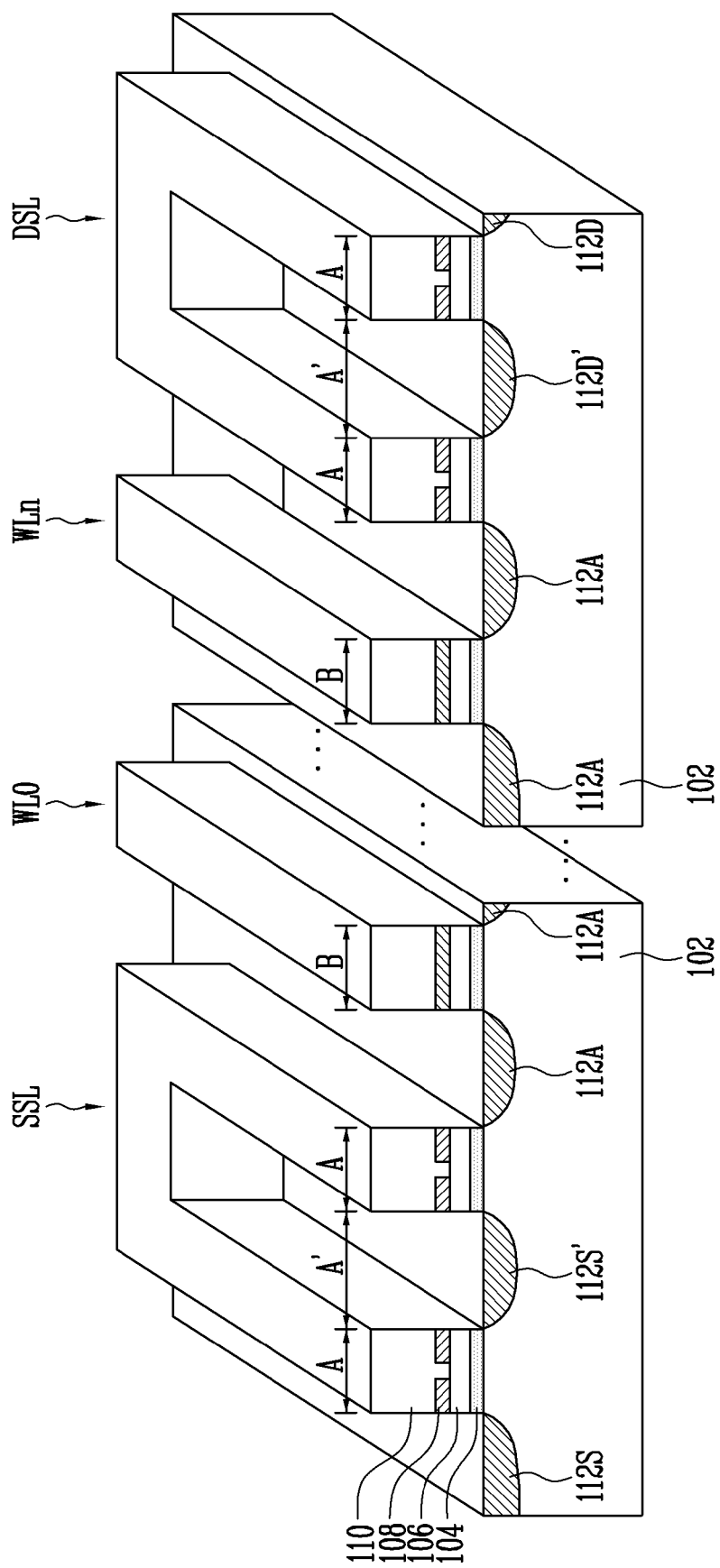
FIG. 1C is a perspective view illustrating the memory cell array in the semiconductor memory device according to the present invention.

In FIG. 1A to FIG. 1C, device separating films (not shown) are formed in parallel with a given space in a device separating area of a semiconductor substrate 102. As a result, a plurality of active areas ACT are disposed in parallel to one another.

A select line and word lines WL0 to WLn are repeatedly formed in parallel and in a direction crossing over the active area ACT. Here, the select line includes a source select line SSL and a drain select line DSL. In addition, 16, 32 or 64 word lines are generally formed between the source select line SSL and the drain select line DSL, but for better understanding, FIGS. 1A to 1C show only 2 word lines.

The source select line SSL, the word lines WL0 to WLn and the drain select line DSL are formed by laminating in sequence a tunnel insulating film 104, a floating gate 106, a dielectric film 108 and a control gate 110 over the semiconductor substrate 102.

Further, in the source select line SSL and the drain select line DSL, a part of the dielectric film 108 is removed, and the control gate 110 is electrically connected to the floating gate 106.

A drain select transistor Td is formed in a cross area of the drain select line DSL and the active area ACT, and a source select transistor Ts is formed in a cross area of the source select line SSL and the active area ACT.

Additionally, memory cells (cell0 ... celln) are formed in a respective cross area of each of the word lines WL0 to WLn and the active area ACT.

Junction areas 112A, 112S, 112S', 112D and 112D' are formed between the source select line SSL, the word lines WL0 to WLn and between the drain select line DSL.

Here, the junction area 112A of the memory cell array is formed in the active area ACT between the word lines WL0 to WLn. Moreover, the junction area 112D formed between the drain select lines DSL corresponds to a drain area, and the junction area 112S formed between the source select lines SSL corresponds to a source area.

The drain area is coupled to each of bit lines BLo to BLn (FIG. 1B), and the source area is coupled to a common source line CSL (FIG. 1B). Further, the junction area 112S' is formed at a middle of a plane of the source select line SSL, and the junction area 112D' is formed at a middle of a plane of the drain select line DSL.

The plane of the source select line SSL and the plane of the drain select line DSL have horseshoe shape, i.e. generally U like shape. As a result, in the source select line SSL, a dual gate is formed by two source select transistors Ts. In addition, in the drain select line DSL, a dual gate is formed by two drain select transistors Td.

Line width A of the source select line SSL and a line width A of the drain select line DSL is same or substantially equal to a width B of each of the word lines WL0 to WLn.

Additionally, each of a width A' of a width between the source select lines SSL and a width A' of a width between the drain select lines DLS is same or substantially equal to the width B of each of the word lines WL0 to WLn.

The source select line SSL and the drain select line DSL may be formed in generally U like shape during the process of pattern forming. In another embodiment of the present invention, the source select line SSL and the drain select line DSL may be formed with generally U shape by etching the middle space after formed in a straight line shape.

Generally, as the size of the semiconductor memory device is reduced, the number of the source select line SSL, the word lines WL0 to WLn and the drain select line DSL formed in a unit area is increased. Accordingly, a technique of reducing line widths of the source select line SSL, the word lines WL0 to WLn and the drain select line DSL has been continuously developed.

However, a process of reducing the line width of the source select line SSL and the line width of the drain select line DSL is harder than that of reducing the line width of each of the word lines WL0 to WLn.

In case of reducing the line widths of the source select line SSL and the drain select line DSL, a width of gates of the source select line SSL and the drain select line DSL is reduced. As a result, the junction areas formed at both the terminals of each of the transistors Ts and Td are connected to each other.

Further, the punch through phenomenon causes the transistors Ts and Td to lose their switching ability, and hence a leakage current may be generated. Accordingly, since it is difficult to reduce the line widths of the source select line SSL and the drain select line DSL though the line widths of the word lines WL0 to WLn are reduced for the purpose of enhancing integrity of the semiconductor memory device, it is difficult to enhance the integrity of the semiconductor memory device.

However, in one embodiment of the present invention, the junction area 112S' formed between the source select lines SSL prevents the connection of the junction areas formed at both terminals of the source select transistor Ts. In addition, the junction area 112D' formed between the drain select lines DSL prevents the connection of the junction areas formed at both terminals of the drain select transistor Td. Accordingly, the punch through phenomenon is avoided. As a result, the transistors Ts and Td do not lose their switching ability, and hence the leakage current is not generated.

In addition, the line width A and the space width A' between the source select lines SSL and the drain select lines DSL may be substantially the same as line width B of each of the word lines WL0 to WLn. Hence, the total line width A+A'+A of the source select line SSL and the drain select line DSL may be easily reduced.

The following Table shows the total line width A+A'+A of the source select line SSL and the drain select line DSL formed in accordance with the line width B of each of the word lines WL0 to WLn.

TABLE 1

| Line width B of the word line | Total line width A + A' + A of the select lines |
|---|---|
| 60 nm | 180 nm |
| 50 nm | 150 nm |
| 40 nm | 120 nm |

Referring to Table 1, the line width B of each of the word lines WL0 to WLn is reduced as a microscopic process technique of the semiconductor memory device. The total line width A+A'+A of the source select line SSL and the drain select line DSL is reduced. Accordingly, high integrated semiconductor memory device may be manufactured.

Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A memory cell array in a semiconductor memory device comprising:
    a semiconductor substrate having active areas and isolation areas;
    a first junction area to be coupled to a common source line;
    a second junction area to be coupled to a bit line;
    first to $n^{th}$ word lines located on the semiconductor substrate and configured to cross over the active areas and the isolation areas;
    first and second source select lines located on the semiconductor substrate between the first junction area and the first word line, wherein ends of the first and second source select lines are connected with each other; and
    first and second drain select lines located on the semiconductor substrate between the second junction area and the $n^{th}$ word line, wherein ends of the first and second drain select lines are connected with each other.

2. The memory cell away of claim 1, wherein first and second source select transistors are formed in a cross area of the first and second source select lines and the active areas, and first and second drain select transistors are formed in a cross area of the first and second drain select lines and the active areas.

3. The memory cell away of claim 2, wherein a third junction area is formed at the active area located between the first and second source select lines, fourth junction areas are formed at the active areas located at both sides of the word lines, and a five junction area is formed at the active area located between the first and second drain select lines.

4. The memory cell away of claim 1, wherein the first and second source select lines and the first and second drain select lines have a line width being the same as or substantially equal to that of the word lines.

5. The memory cell away of claim 1, wherein a width between the source select lines and a width between the drain select lines are the same as or substantially equal to that of the word lines.

6. A memory cell array in a semiconductor memory device comprising:

a cell string including a plurality of memory cells, wherein the memory cells are connected in series;

first and second source select transistors coupled between a common source line and the cell string, wherein gates of the first and second source select transistors are coupled with each other; and first and second drain select transistors coupled between a bit line and the cell string, wherein gates of the first and second drain select transistors are coupled with each other.

7. The memory cell away of claim 6, wherein the gates of the first and second source select transistors are coupled to a source select line.

8. The memory cell away of claim 6, wherein the gates of the first and second drain select transistors are coupled to a drain select line.

\* \* \* \* \*